(12) United States Patent
Ma et al.

(10) Patent No.: US 9,961,819 B2
(45) Date of Patent: May 1, 2018

(54) AUXILIARY ADHESIVE DISPENSING APPARATUS

(71) Applicant: HUAWEI DEVICE (DONGGUAN) CO., LTD., Dongguan (CN)

(72) Inventors: Fuqiang Ma, Shenzhen (CN); Haixing Ding, Shenzhen (CN)

(73) Assignee: HUAWEI DEVICE (DONGGUAN) CO., LTD., Shenzhen (CN)

( * ) Notice: Subject to any disclaimer, the term of this patent is extended or adjusted under 35 U.S.C. 154(b) by 62 days.

(21) Appl. No.: 15/107,373

(22) PCT Filed: Mar. 4, 2015

(86) PCT No.: PCT/CN2015/073644
§ 371 (c)(1),
(2) Date: Jun. 22, 2016

(87) PCT Pub. No.: WO2015/131826
PCT Pub. Date: Sep. 11, 2015

(65) Prior Publication Data
US 2017/0006743 A1    Jan. 5, 2017

(30) Foreign Application Priority Data
Mar. 4, 2014    (CN) .................... 2014 2 0096534 U

(51) Int. Cl.
*B29C 65/54* (2006.01)
*B32B 37/12* (2006.01)
(Continued)

(52) U.S. Cl.
CPC .......... *H05K 13/0469* (2013.01); *H05K 3/30* (2013.01); *H05K 5/064* (2013.01); *H05K 9/0028* (2013.01)

(58) Field of Classification Search
USPC .......................................... 156/578
See application file for complete search history.

(56) References Cited

U.S. PATENT DOCUMENTS 5,308,644 A * 5/1994 Kawakami ........... H05K 3/1233
                                                              427/404
5,368,219 A * 11/1994 Hogan .................... B05B 12/06
                                                              118/324
(Continued)

FOREIGN PATENT DOCUMENTS

CN          202962777 U      6/2013
CN          202977375 U      6/2013
(Continued)

OTHER PUBLICATIONS

Machine Translation and Abstract of German Patent Application No. DE102004043478, Part 1, Apr. 14, 2005, 13 pages.
(Continued)

*Primary Examiner* — Sing P Chan
(74) *Attorney, Agent, or Firm* — Conley Rose, P.C.

(57) ABSTRACT

An auxiliary adhesive dispensing apparatus is connected to a printed circuit board (PCB) through an opening on a side surface of a shielding cover above the PCB, and the auxiliary adhesive dispensing apparatus includes a flow guiding groove, an adhesive-injection opening connected to an end of the flow guiding groove, and a fixing part connecting the flow guiding groove and the PCB. The auxiliary adhesive dispensing apparatus is connected to a PCB through an opening on a side surface of a shielding cover above the PCB. By means of the auxiliary adhesive dispensing apparatus, an adhesive dispensing operation can still be performed after a shielding cover is mounted, so that the adhesive dispensing operation can be performed after second-reflow soldering processing.

16 Claims, 2 Drawing Sheets

(51) Int. Cl.
*B32B 43/00* (2006.01)
*H05K 13/04* (2006.01)
*H05K 9/00* (2006.01)
*H05K 3/30* (2006.01)
*H05K 5/06* (2006.01)

(56) References Cited

U.S. PATENT DOCUMENTS

| | | | | |
|---|---|---|---|---|
| 5,415,337 | A * | 5/1995 | Hogan | B05B 12/06 228/102 |
| 5,495,399 | A * | 2/1996 | Gore | H05K 9/0032 174/354 |
| 6,409,859 | B1 * | 6/2002 | Chung | B32B 7/12 156/250 |
| 6,428,650 | B1 * | 8/2002 | Chung | B29C 65/526 156/250 |
| 7,639,513 | B2 * | 12/2009 | Otsuki | H01L 23/5387 361/760 |
| 7,751,194 | B2 * | 7/2010 | Sakamoto | H05K 7/20009 165/185 |
| 8,102,670 | B2 * | 1/2012 | Sakamoto | H05K 1/144 361/792 |
| 8,748,505 | B2 * | 6/2014 | Niiyama | C08F 290/067 520/1 |
| 2006/0067070 | A1 * | 3/2006 | Otsuki | H01L 23/5387 361/816 |
| 2009/0086431 | A1 * | 4/2009 | Sakamoto | H05K 7/20009 361/695 |
| 2009/0086455 | A1 * | 4/2009 | Sakamoto | H05K 1/144 361/796 |
| 2012/0211080 | A1 * | 8/2012 | Niiyama | C08F 290/067 136/259 |
| 2013/0029075 | A1 * | 1/2013 | Niiyama | G02F 1/133308 428/41.7 |
| 2013/0306236 | A1 * | 11/2013 | Niiyama | C08F 290/067 156/285 |
| 2016/0025586 | A1 * | 1/2016 | Ghannam | G01L 5/0052 73/862.381 |
| 2016/0197031 | A1 * | 7/2016 | Kim | H01L 23/3128 257/738 |
| 2017/0295679 | A1 * | 10/2017 | Kim | H05K 9/0088 |

FOREIGN PATENT DOCUMENTS

| | | |
|---|---|---|
| CN | 203140247 U | 8/2013 |
| CN | 203803741 U | 9/2014 |
| DE | 19634265 C1 | 3/1998 |
| DE | 102004043478 A1 | 4/2005 |
| EP | 1306887 A1 | 5/2003 |
| JP | 2000151083 A | 5/2000 |
| JP | 2011151051 A | 8/2011 |
| JP | 2013055235 A | 3/2013 |

OTHER PUBLICATIONS

Machine Translation and Abstract of German Patent Application No. DE102004043478, Part 2, Apr. 14, 2005, 2 pages.
Foreign Communication From A Counterpart Application, European Application No. 15758770.0, Extended European Search Report dated Feb. 7, 2017, 7 pages.
Partial English Translation and Abstract of Chinese Patent Application No. CN203803741, Jun. 30, 2016, 2 pages.
Foreign Communication From A Counterpart Application, PCT Application No. PCT/CN2015/073644, English Translation of International Search Report dated May 27, 2015, 2 pages.
Foreign Communication From A Counterpart Application, PCT Application No. PCT/CN2015/073644, English Translation of Written Opinion dated May 27, 2015, 5 pages.

* cited by examiner

AUXILIARY ADHESIVE DISPENSING APPARATUS

CROSS-REFERENCE TO RELATED APPLICATIONS

This application is a U.S. National Stage of International Application No. PCT/CN2015/073644, filed on Mar. 4, 2015, which claims priority to Chinese Patent Application No. 201420096534.4, filed on Mar. 4, 2014, both of which are hereby incorporated by reference in their entireties.

TECHNICAL FIELD

The present disclosure relates to the field of assembly of electric circuit boards, and in particular, to an auxiliary adhesive dispensing apparatus.

BACKGROUND

A printed circuit board (PCB) is an important electric part, and is used to provide circuit connections to electric parts and components. A PCB assembly (PCBA) refers to assembly of various electric components on a circuit board by using a surface packaging process, to form a modular product, which is provided to a customer. By means of soldering, the customer client solders the modular product to a main board. For a modular product having a relatively high reliability requirement, to improve the reliability of the modular product, before production is complete, adhesive dispensing usually needs to be performed on some components inside the modular product by using a packaging-level underfill material, so as to increase the reliability of solder joints of the components, and produce a particular moisture-proof effect for the components.

A material for adhesive dispensing is usually resin, and an adhesive dispensing operation is usually performed before a shielding cover is mounted. For a second-reflow modular product (that is, a modular product that needs to be assembled on a main board by using a surface mount and soldering technology) having a high reliability requirement, after the shielding cover is mounted, second-reflow soldering processing needs to be performed. Therefore, an adhesive dispensing operation is also performed before second reflow soldering. It is well known that a process of second-reflow soldering processing is usually accompanied with high-temperature processing (for example, a temperature higher than 250 degrees Celsius (° C.)). At a high temperature, soldering tin enveloped by resin melts, and molten soldering tin flows inside a chip to cause a short circuit inside the chip, causing a function of a product to fail.

To resolve the foregoing problem, a solution is to perform an adhesive dispensing operation after second-reflow soldering processing. However, second-reflow soldering processing is required to be performed after a shielding cover is mounted. Therefore, how to implement that an adhesive dispensing operation can still be performed after a shielding cover is mounted becomes a key to the resolution of the foregoing problem.

SUMMARY

In view of this, an object of the present disclosure is to provide an auxiliary adhesive dispensing apparatus, so as to resolve a problem that an adhesive dispensing operation can no longer be performed after a shielding cover is mounted.

To achieve the foregoing objective, the present application provides the following technical solutions.

According to a first aspect, an auxiliary adhesive dispensing apparatus is provided, where the auxiliary adhesive dispensing apparatus is connected to a PCB through an opening on a side surface of a shielding cover above the PCB, and the auxiliary adhesive dispensing apparatus includes a flow guiding groove, an adhesive-injection opening connected to an end of the flow guiding groove, and a fixing part connecting the flow guiding groove and the PCB.

In a first possible implementation manner, the fixing part is a surface mount element.

With reference to the first possible implementation manner, in a second possible implementation manner, the surface mount element is connected to the other end of the flow guiding groove.

With reference to the first possible implementation manner or the second possible implementation manner, in a third possible implementation manner, the apparatus further includes a holding part located at the adhesive-injection opening.

With reference to the first aspect, in a fourth possible implementation manner, the fixing part is a positioning post that is located at a bottom of the flow guiding groove and that fits a positioning hole located on the PCB.

With reference to the first aspect or any one of the first to fourth possible implementation manners of the first aspect, in a fifth possible implementation manner, a cross section of the flow guiding groove is arc-shaped, rectangular, triangular, or rhombic.

An auxiliary adhesive dispensing apparatus provided in this embodiment of the present disclosure is connected to a PCB through an opening on a side surface of a shielding cover above the PCB. In a process of adhesive dispensing, an adhesive dispensing machine injects an adhesive to an adhesive-injection opening, and the adhesive flows along a flow guiding groove connected to the adhesive-injection opening to reach a position at which adhesive dispensing is needed, and eventually cures to complete adhesive dispensing. By means of the auxiliary adhesive dispensing apparatus, an adhesive dispensing operation can still be performed after a shielding cover is mounted, so that the adhesive dispensing operation can be performed after second-reflow soldering processing. By means of the auxiliary adhesive dispensing apparatus, an adhesive dispensing operation is completed after second reflow soldering, and there is no more second reflow soldering after adhesive dispensing is complete, which can reduce risks of tin bridging in a chip at which adhesive dispensing is performed and tin balls at a peripheral chip.

BRIEF DESCRIPTION OF DRAWINGS

To describe the technical solutions in the embodiments of the present disclosure or in the prior art more clearly, the following briefly introduces the accompanying drawings required for describing the embodiments or the prior art. The accompanying drawings in the following description show some embodiments of the present disclosure, and a person of ordinary skill in the art may still derive other drawings from these accompanying drawings without creative efforts.

DESCRIPTION OF EMBODIMENTS

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. The described embodiments are some but not all of the embodiments of the present disclosure. All other embodiments obtained by a person of ordinary skill in the art based on the embodiments of the present disclosure without creative efforts shall fall within the protection scope of the present disclosure.

A shielding cover is usually a metal casing. In a process of assembling a modular product, a shielding cover needs to be mounted above a PCB, so that the shielding cover and the PCB together form a sealed cavity, so as to protect components packaged on the PCB, and at the same time provide a shield from external interference. In a conventional packaging process, an adhesive dispensing operation needs to be performed before a shielding cover is mounted, and it is after adhesive dispensing that the shielding cover can be further mounted so that the shielding cover and the PCB together form a sealed cavity and subsequent second-reflow soldering processing is performed. To resolve a defect that an adhesive dispensing operation is required to be performed before a shielding cover is mounted in the prior art, an embodiment of the present disclosure provides an auxiliary adhesive dispensing apparatus, where the auxiliary adhesive dispensing apparatus can help an adhesive dispensing machine perform an adhesive dispensing operation after a shielding cover is mounted.

Figure 1A:
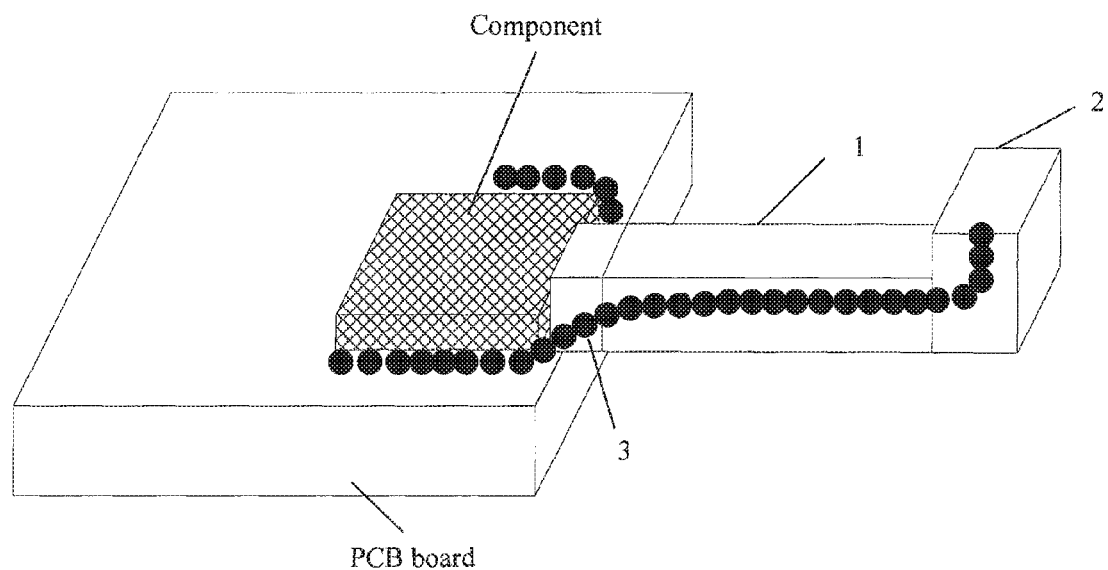
FIG. 1A is a schematic structural diagram of an auxiliary adhesive dispensing apparatus being mounted on a PCB without a shielding cover.
Figure 1B:
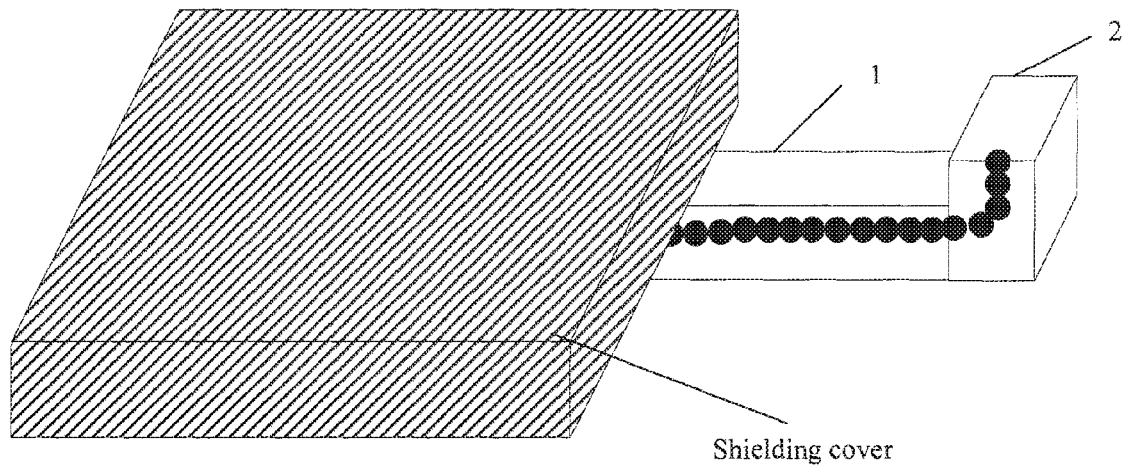
FIG. 1B is a schematic structural diagram of an auxiliary adhesive dispensing apparatus being mounted on a PCB with a shielding cover.

An embodiment of the present disclosure provides an auxiliary adhesive dispensing apparatus, where the auxiliary adhesive dispensing apparatus is connected to a PCB through an opening on a side surface of a shielding cover above the PCB. As shown in FIG. 1A and 1B, for clarity, FIG. 1A shows a schematic structural diagram of an auxiliary adhesive dispensing apparatus being mounted on a PCB without a shielding cover, and FIG. 1B shows a schematic structural diagram of an auxiliary adhesive dispensing apparatus being mounted on a PCB with a shielding cover. The auxiliary adhesive dispensing apparatus includes a flow guiding groove 1, an adhesive-injection opening 2 connected to the flow guiding groove 1, and a fixing part 3, where the fixing part 3 is used to fix the auxiliary adhesive dispensing apparatus on the PCB. Multiple components are usually mounted on the PCB, where adhesive dispensing needs to be performed at a component or some components. The auxiliary adhesive dispensing apparatus provided in this embodiment of the present disclosure can help an adhesive dispensing machine complete adhesive dispensing at a component at which adhesive dispensing needs to be performed on the PCB.

The flow guiding groove 1 is a concave groove having a particular depth. In a process of use, the flow guiding groove 1 is used as a channel for an adhesive to flow in. In FIG. 1A, a black circular area is an adhesive. In a process of adhesive dispensing, an adhesive dispensing machine (not shown in the figure) injects the adhesive to the adhesive-injection opening 2, and the adhesive flows along the flow guiding groove 1 connected to the adhesive-injection opening 2 to reach a component at which adhesive dispensing is needed, and eventually cures to complete adhesive dispensing.

The flow guiding groove 1 may have multiple different structures. For example, a cross section of the flow guiding groove 1 may be arc-shaped, rectangular, triangular, rhombic, or the like, or certainly may be in other shapes, as long as a path for an adhesive to flow in can be provided.

After adhesive dispensing is complete, the auxiliary adhesive dispensing apparatus may be left inside the product and stay as a part of the product, or may be removed, which is not limited herein.

An auxiliary adhesive dispensing apparatus provided in this embodiment of the present disclosure is connected to a PCB through an opening on a side surface of a shielding cover above the PCB. In a process of adhesive dispensing, an adhesive dispensing machine injects an adhesive to an adhesive-injection opening, and the adhesive flows along a flow guiding groove connected to the adhesive-injection opening to reach a position at which adhesive dispensing is needed, and eventually cures to complete adhesive dispensing. By means of the auxiliary adhesive dispensing apparatus, an adhesive dispensing operation can still be performed after a shielding cover is mounted, so that the adhesive dispensing operation can be performed after second-reflow soldering processing. By means of the auxiliary adhesive dispensing apparatus, an adhesive dispensing operation is completed after second reflow soldering, so that there is no more second reflow soldering after adhesive dispensing is complete, which can reduce risks of tin whisker bridging in a chip at which adhesive dispensing is performed and tin balls at a peripheral chip.

Moreover, in the prior art, during an adhesive dispensing operation before second-reflow soldering processing, a PCB needs to be washed, examined, baked, and processed in other manners before the adhesive dispensing operation, so as to ensure an effect of adhesive filling. By means of the auxiliary adhesive dispensing apparatus provided in the present disclosure, after second-reflow soldering processing, adhesive dispensing is performed on a modular product that passes a functional test, so that before adhesive dispensing on the modular product, operations such as washing, examination, and baking do not need to be performed; therefore, after the auxiliary adhesive dispensing apparatus is used, a production process of a modular product is simplified, a manufacturing period of the product is shortened, and the introduction of the apparatus does not increase production difficulty, so that a manufacturing cost is reduced and at the same time manufacturing quality of the product and reliability of the product can be ensured.

Figure 2:
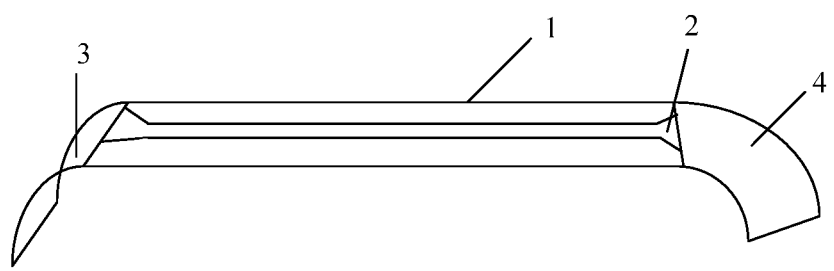
FIG. 2 is a schematic structural diagram of a structure of an auxiliary adhesive dispensing apparatus according to an embodiment of the present disclosure.

In a structure, the fixing part 3 is a surface mount element located at an end, away from the adhesive-injection opening 2, of the flow guiding groove 1, so that the fixing part 3 can be fixed on the PCB by using a surface mount method, as shown in FIG. 2. When the fixing part 3 is fixed on the PCB in a surface mount manner, the adhesive-injection opening inside the auxiliary adhesive dispensing apparatus can at the same time be used as a suction part. In this way, a vacuum generating device is used to remove air inside the flow guiding groove through the adhesive-injection opening, so that a vacuum is generated inside the flow guiding groove to produce an external force that can used to hold the flow guiding groove. By means of this external force, an operation of picking up or dropping the flow guiding groove is performed, so as to conveniently fix the fixing part 3 on the PCB.

A holding part 4 may be further included. When the fixing part 3 is attached on the PCB in a surface mount manner, the holding part 4 may be used as a supporting part to support the auxiliary adhesive dispensing apparatus. The suction part 4 may be a magnetic metal part or have a structure of another type.

Figure 3:
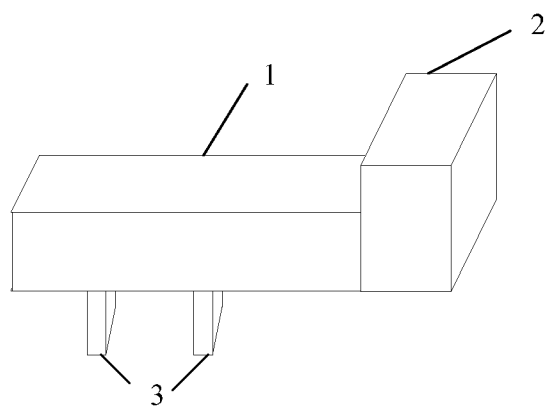
FIG. 3 is a schematic structural diagram of another structure of an auxiliary adhesive dispensing apparatus according to an embodiment of the present disclosure.

In another structure, the fixing part 3 is fixed on the PCB in a manner of wave soldering, as shown in FIG. 3. In the structure, the fixing part 3 is one or more positioning posts. These positioning posts fix the auxiliary adhesive dispensing apparatus on the PCB in a manner of a through hole reflow and through hole technology. These positioning posts may be evenly distributed or unevenly distributed along a length direction of the flow guiding groove 1, and the present disclosure is not limited thereto.

It should be noted that in any structure of the present disclosure, the fixing part 3 is preferably fixed on the PCB in a soldering manner, so as to enhance the firmness between the auxiliary adhesive dispensing apparatus and the PCB. The soldering manner includes wave soldering, reflow soldering, hand soldering, and the like, and the present disclosure is not limited thereto.

The auxiliary adhesive dispensing apparatus in this embodiment of the present disclosure is not limited to the structures shown in FIG. 1 to FIG. 3, or may have another structure, which is no longer enumerated herein.

It should be noted that the auxiliary adhesive dispensing apparatus in this embodiment of the present disclosure is not only applicable to the foregoing process of adhesive dispensing on a single board, but also applicable to a process of filling a sealed cavity, for example, pouring sealant, and coating.

The foregoing descriptions are merely exemplary implementation manners of the present disclosure. It should be noted that a person of ordinary skill in the art may make several improvements or polishing without departing from the principle of the present disclosure and the improvements or polishing shall fall within the protection scope of the present disclosure.

The invention claimed is:

1. An auxiliary adhesive dispensing apparatus, comprising:
 a flow guiding groove;
 an adhesive-injection opening connected to an end of the flow guiding groove; and
 a fixing part connecting the flow guiding groove and a printed circuit board (PCB),
 wherein the auxiliary adhesive dispensing apparatus is connected to the PCB through an opening on a side surface of a shielding cover above the PCB.

2. The auxiliary adhesive dispensing apparatus according to claim 1, wherein the fixing part comprises a surface mount element.

3. The auxiliary adhesive dispensing apparatus according to claim 2, wherein the surface mount element is connected to the other end of the flow guiding groove.

4. The auxiliary adhesive dispensing apparatus according to claim 3, wherein a cross section of the flow guiding groove is arc-shaped, rectangular, triangular, or rhombic.

5. The auxiliary adhesive dispensing apparatus according to claim 3, further comprising a holding part located at the adhesive-injection opening.

6. The auxiliary adhesive dispensing apparatus according to claim, 5, wherein a cross section of the flow guiding groove is arc-shaped, rectangular, triangular, or rhombic.

7. The auxiliary adhesive dispensing apparatus according to claim 2, further comprising a holding part located at the adhesive-injection opening.

8. The auxiliary adhesive dispensing apparatus according to claim 7, wherein a cross section of the flow guiding groove is arc-shaped, rectangular, triangular, or rhombic.

9. The auxiliary adhesive dispensing apparatus according to claim 2, wherein a cross section of the flow guiding groove is arc-shaped, rectangular, triangular, or rhombic.

10. The auxiliary adhesive dispensing apparatus according to claim 1, wherein the fixing part comprises a positioning post that is located at a bottom of the flow guiding groove and that fits a positioning hole located on the PCB board.

11. The auxiliary adhesive dispensing apparatus according to claim 10, wherein a cross section of the flow guiding groove is arc-shaped, rectangular, triangular, or rhombic.

12. The auxiliary adhesive dispensing apparatus according to claim 1, wherein a cross section of the flow guiding groove is arc-shaped, rectangular, triangular, or rhombic.

13. The auxiliary adhesive dispensing apparatus according to claim 1, wherein a cross section of the flow guiding groove is arc-shaped.

14. The auxiliary adhesive dispensing apparatus according to claim 1, wherein a cross section of the flow guiding groove is rectangular.

15. The auxiliary adhesive dispensing apparatus according to claim 1, wherein a cross section of the flow guiding groove is triangular.

16. The auxiliary adhesive dispensing apparatus according to claim 1, wherein a cross section of the flow guiding groove is rhombic.

* * * * *